(12) United States Patent
Larsen

(10) Patent No.: US 8,804,985 B2
(45) Date of Patent: Aug. 12, 2014

(54) SYSTEMS AND METHODS FOR HIGH PASS FILTERING WITH SMART SATURATION

(75) Inventor: Christian Larsen, Irvine, CA (US)

(73) Assignee: Conexant Systems, Inc., Irvine, CA (US)

( * ) Notice: Subject to any disclaimer, the term of this patent is extended or adjusted under 35 U.S.C. 154(b) by 657 days.

(21) Appl. No.: 13/040,121

(22) Filed: Mar. 3, 2011

(65) Prior Publication Data

US 2012/0224724 A1   Sep. 6, 2012

(51) Int. Cl.
*H02B 1/00* (2006.01)

(52) U.S. Cl.
USPC ............... 381/123; 381/55; 381/56; 381/57; 381/58; 381/59; 381/81; 700/94

(58) Field of Classification Search
USPC ......... 381/55, 56, 57, 58, 59, 81, 123; 700/94
See application file for complete search history.

(56) References Cited

U.S. PATENT DOCUMENTS

2008/0219459 A1*   9/2008   Bongiovi et al. ............... 381/57

* cited by examiner

*Primary Examiner* — Paul Kim
(74) *Attorney, Agent, or Firm* — Jackson Walker L.L.P.; Christopher J. Rourk

(57) ABSTRACT

An audio processing system that includes an audio filter having one or more elements capable of having state, such as a capacitor, an inductor or a delay. A saturation detector is configured to detect saturation of the audio filter and to generate an output when saturation of the filter is detected, such as a switch control signal. A switch is connected to the audio filter and the saturation detector, wherein the state of one or more of the elements of the audio filter is changed when the saturation detector provides the output to the switch, such as when the switch shorts the element and causes the energy stored in the element to be dissipated.

17 Claims, 14 Drawing Sheets

SYSTEMS AND METHODS FOR HIGH PASS FILTERING WITH SMART SATURATION

FIELD OF THE INVENTION

The present disclosure relates generally to high pass filter and specifically with suppressing saturation peaks in high pass filter outputs.

BACKGROUND OF THE INVENTION

High pass filters are common blocks used in many fields of engineering, including communications, signal processing and audio. In audio, high pass filters are used to suppress low frequency audio from being played into small speakers.

High pass filters exist both in continuous time and discrete time forms.

SUMMARY OF INVENTION

An audio processing system that includes an audio filter having one or more elements capable of having state, such as a capacitor, an inductor or a delay. A saturation detector is configured to detect saturation of the audio filter and to generate an output when saturation of the filter is detected, such as a switch control signal. A switch is connected to the audio filter and the saturation detector, wherein the state of one or more of the elements of the audio filter is changed when the saturation detector provides the output to the switch, such as when the switch shorts the element and causes the energy stored in the element to be dissipated.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE INVENTION

A detailed description of embodiments of the present disclosure is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

In audio systems, high pass filters are used to suppress low frequency audio from being played into small speakers to prevent damage to the speakers. Various configurations are possible each with their own advantages and disadvantages.

Figure 1:
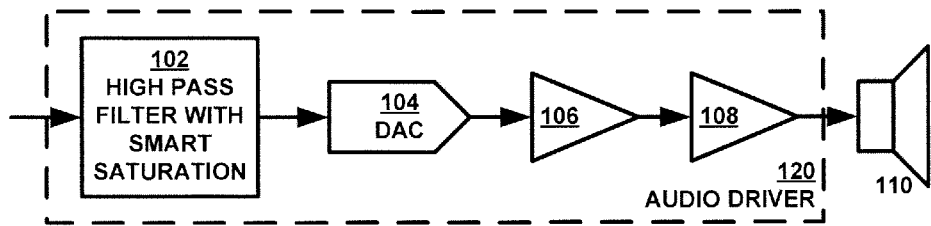
FIG. 1 shows a block diagram of an exemplary embodiment of a digital audio output system employing a high pass filter for speaker protection.

FIG. 1 shows a block diagram of an exemplary embodiment of a digital audio output system employing a high pass filter for speaker protection. The system comprises digital audio driver 120 which drives speaker 110. Digital audio driver 120 comprises digital to audio converter (DAC) 104, amplifier 106 and output driver 108, which is typical of many digital audio drivers. Digital audio driver 120 also comprises high pass filter with smart saturation 102. High pass filter with smart saturation 102 can operate in the digital domain and can be implemented in hardware (such as with delay lines and gain elements) or in a suitable combination of hardware and software (such as on a digital signal processor (DSP)). Digital audio driver 120 as depicted has a two stage output with a separate amplifier and output stage. In other exemplary embodiments, other suitable numbers of stages can also or alternatively be used. It should also be noted that in some embodiments, such as when a class-D amplifier is used, DAC 104 and amplifier 106 can be replaced by a single class-D amplifier.

Figure 2:
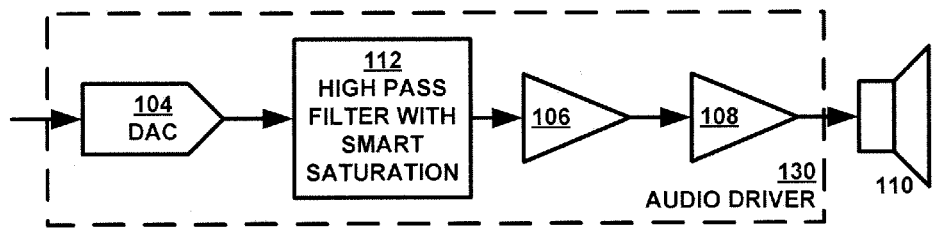
FIG. 2 shows a block diagram of another exemplary embodiment of a digital audio output system employing a high pass filter for speaker protection.

FIG. 2 shows a block diagram of another exemplary embodiment of a digital audio output system employing a high pass filter for speaker protection. The system comprises digital audio driver 130 which drives speaker 110. Digital audio driver 130 includes DAC 104, amplifier 106, output driver 108 and high pass filter with smart saturation 112. In this configuration, high pass filter with smart saturation 112 is downstream from DAC 104.

Figure 3:
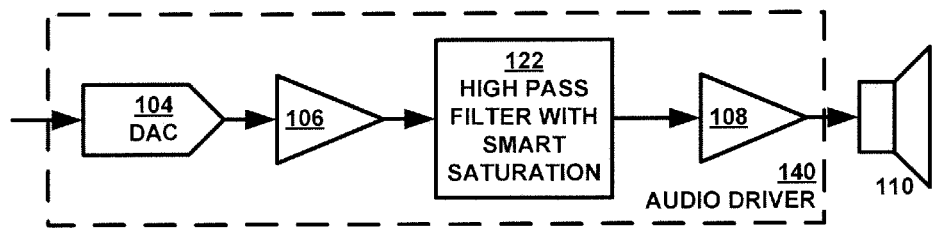
FIG. 3 shows a block diagram of another exemplary embodiment of a digital audio output system employing a high pass filter for speaker protection.

FIG. 3 shows a block diagram of another exemplary embodiment of a digital audio output system employing a high pass filter for speaker protection. The system comprises digital audio driver 140 which drives speaker 110. Digital audio driver 140 includes DAC 104, amplifier 106, output driver 108 and high pass filter with smart saturation 122. In this configuration, high pass filter with smart saturation 122 is downstream from DAC 104.

Figure 4:
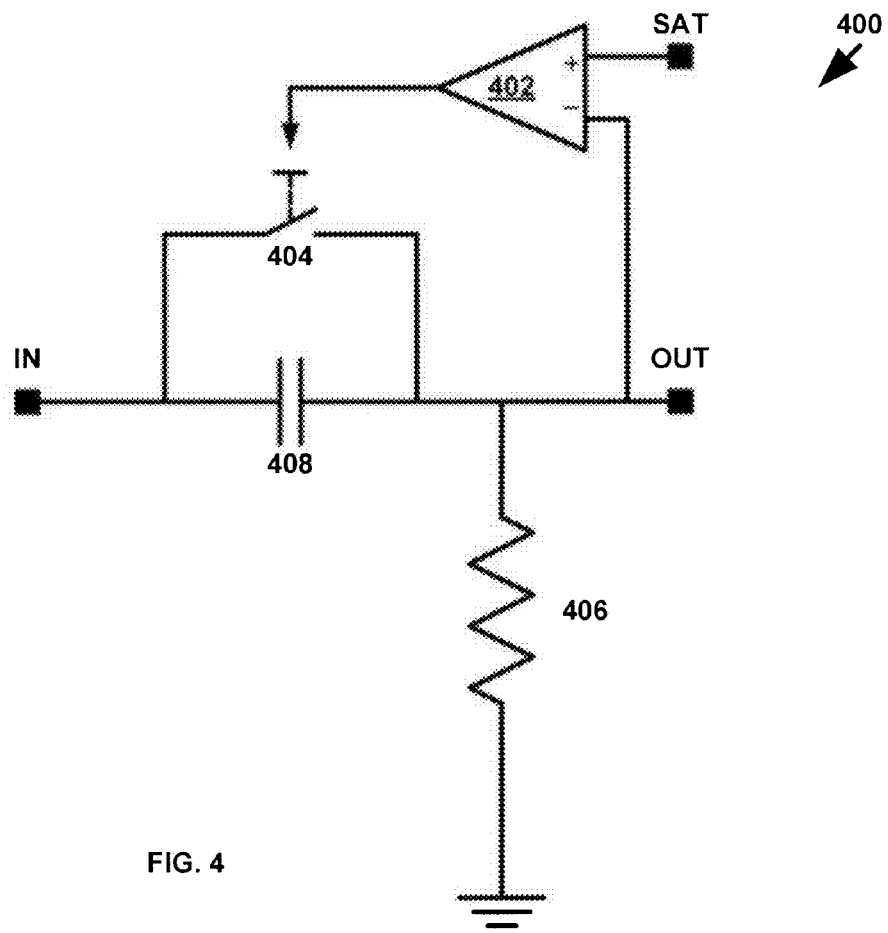
FIG. 4 shows an exemplary embodiment of a first order RC high pass filter with smart saturation.

FIG. 4 shows an exemplary embodiment of a first order RC high pass filter with smart saturation. In addition to capacitor 408 and resistor 406, high pass filter 400 further includes saturation detection circuit 402 and switch 404. When the output reaches or exceeds the saturation level, saturation detection circuit 402 closes switch 404. When switch 404 is closed, the capacitor is discharged, relieving the high pass filter of any state information. By relieving the high pass filter of its state, excess energy stored in the high pass filter is also released. Because switch 404 has a finite resistance, when switch 404 is closed, capacitor 408 is discharged over a small time window. As soon as capacitor 408 is discharged sufficiently to drive the output down to the saturation level, switch 404 opens and the discharging stops. Therefore, capacitor 408 is not completely discharged, but merely discharged sufficiently to prevent the output from exceeding the saturation level.

Figure 5:
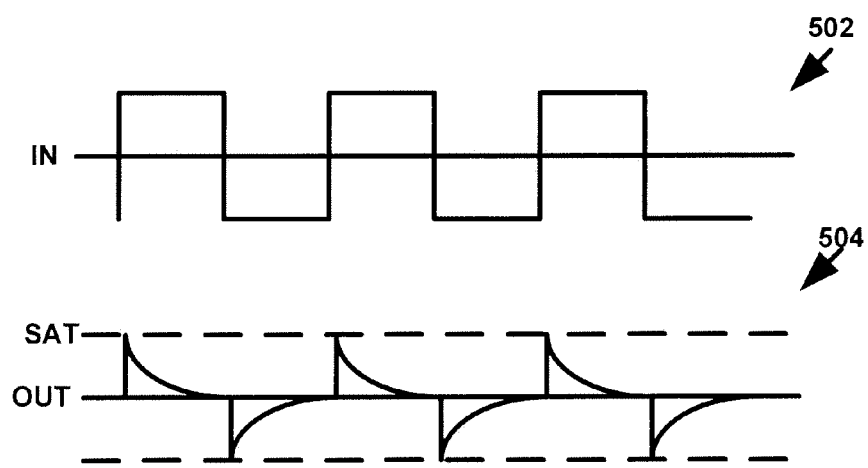
FIG. 5 shows the signaling resulting from a high pass filter with smart saturation.

FIG. 5 shows the signaling resulting from high pass filter 400. Graph 502 shows a square wave input to either high pass filter. In this example, the square wave input has an amplitude near the saturation level. Graph 504 shows the resultant output signal. Rather than sustaining the saturation level while the output of the RC circuit remains above the saturation point, filter 400 immediately begins its RC decay. By doing so, the output signal does not contain as much of the undesired square wave energy and signal maintains much of the spectral information of the signal.

Figure 6:
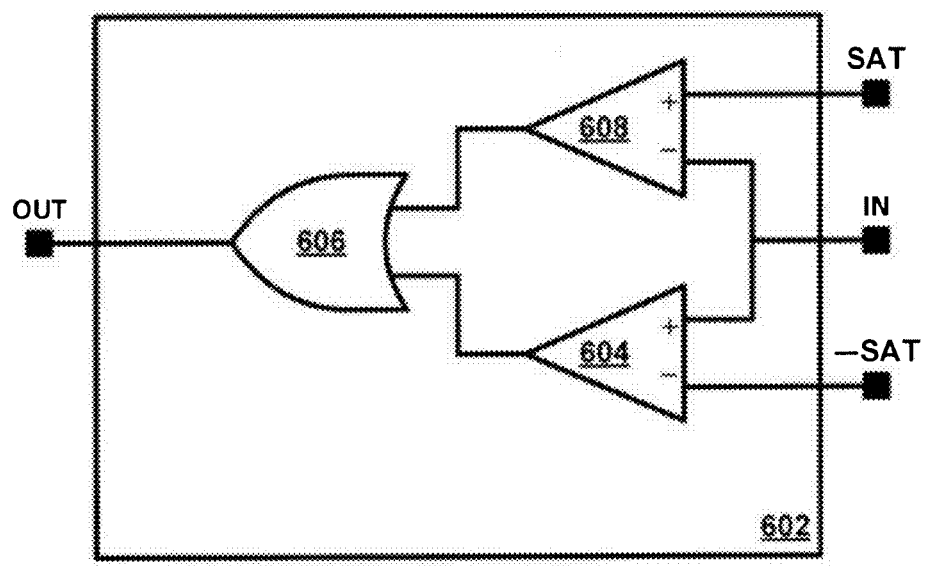
FIG. 6 shows an exemplary embodiment of a saturation detection circuit.

FIG. 6 shows an exemplary embodiment of a saturation detection circuit. In this embodiment, saturation detection circuit 602 includes comparators 604 and 608 and OR gate 606. If the input to saturation detection circuit 602 is greater than the saturation level, comparator 608 produces a positive output. If the input to saturation detection circuit 602 is less than the negative saturation level, comparator 604 produces a positive output. If either comparator has a positive output, OR gate 606 generates a positive output, otherwise it produces a zero output.

Generally, the principle of equipping a high pass filter with smart saturation is to first detect when the filter output exceeds the saturation level. When the saturation level is exceeded, the state within the high pass filter is released down to the level where saturation no longer occurs. While analog filters in general store state in either a capacitor, an inductor or both, it is easier to relieve the state in a capacitor by discharging the charge stored in the capacitor. The examples to follow illustrate this principle in many common high pass filter architectures. Since there are many high pass filter designs, a general principle is shown.

Figure 7:
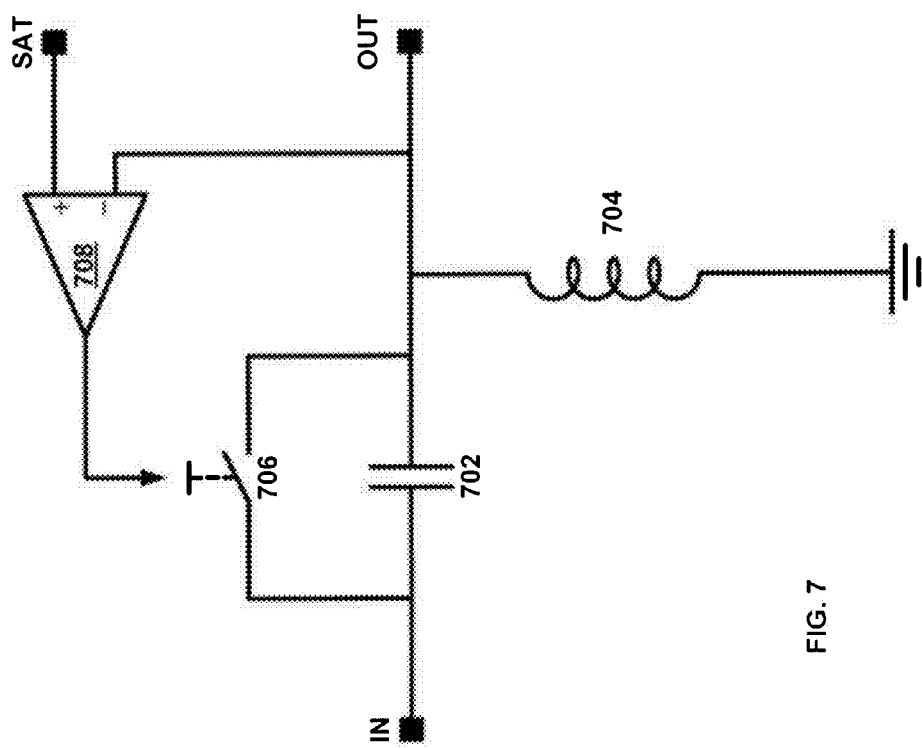
FIG. 7 shows an exemplary embodiment of a first order LC high pass filter with smart saturation.

FIG. 7 shows an exemplary embodiment of a first order LC high pass filter with smart saturation, which is formed by capacitor 702, inductor 704, saturation detection circuit 708 and switch 706. When the output of the LC circuit reaches the saturation level, switch 706 is closed, which discharges capacitor 702 and relieves the high pass filter of its state until the output is driven down to the saturation level.

Figure 8:
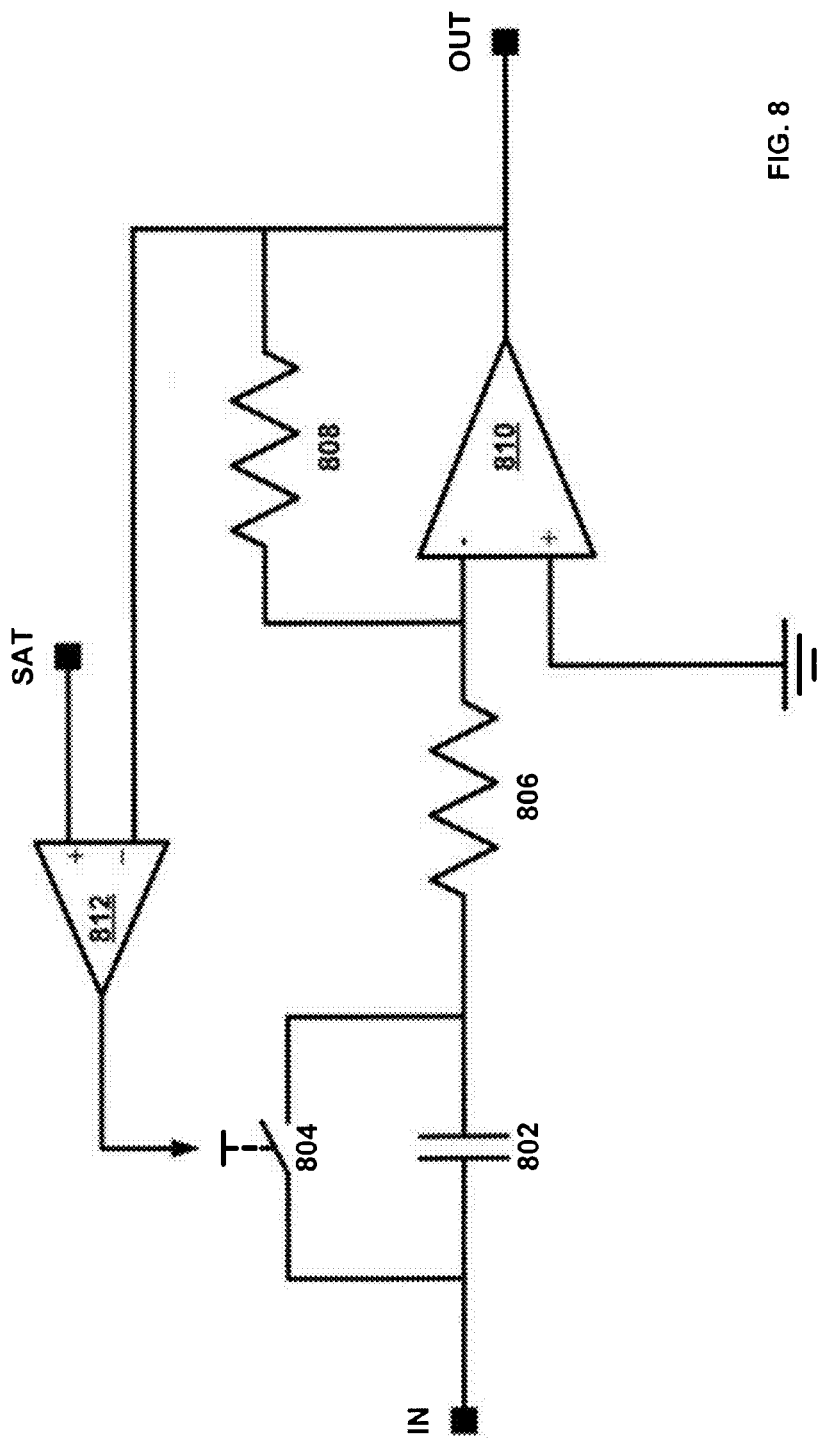
FIG. 8 shows an exemplary embodiment of a first order active high pass filter with smart saturation.

FIG. 8 shows an exemplary embodiment of a first order RC high pass filter with smart saturation, which includes capacitor 802, resistor 806, operational amplifier 810, resistor 808, saturation detection circuit 812 and switch 804. When the filter output exceeds the saturation level, switch 804 is closed, relieving the state in the high pass filter until the output levels no longer exceed the saturation level. During this period, capacitor 802 is discharged.

Figure 9:
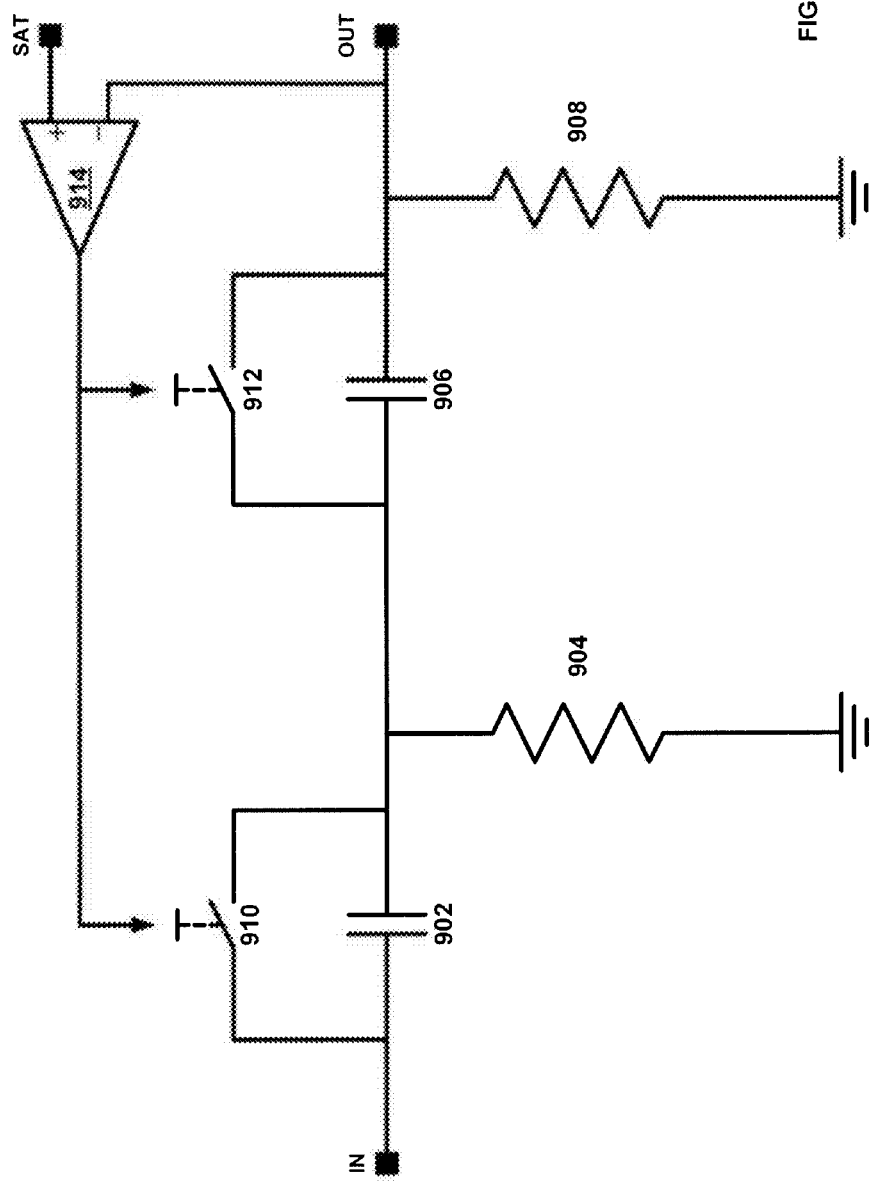
FIG. 9 shows an exemplary embodiment of a second order RC high pass filter with smart saturation.

FIG. 9 shows an exemplary embodiment of a second order RC high pass filter with smart saturation, which includes capacitor 902, resistor 904, capacitor 906, resistor 908, saturation detection circuit 914, switch 910 and switch 912. When the filter output exceeds the saturation level, either or both of switches 910 and 912 are closed to relieve the state in the associated capacitor 902 or 906, respectively, until the output levels no longer exceed the saturation level. In one exemplary embodiment, the capacitor associated with the stage having the shorter time constant (e.g., $\tau_1 < \tau_2$) can be closed first, and the longer time constant can be closed afterwards. This sequence helps ensure that there is enough state to be relieved so that output level can fall within the bounds of the saturation level.

Figure 10:
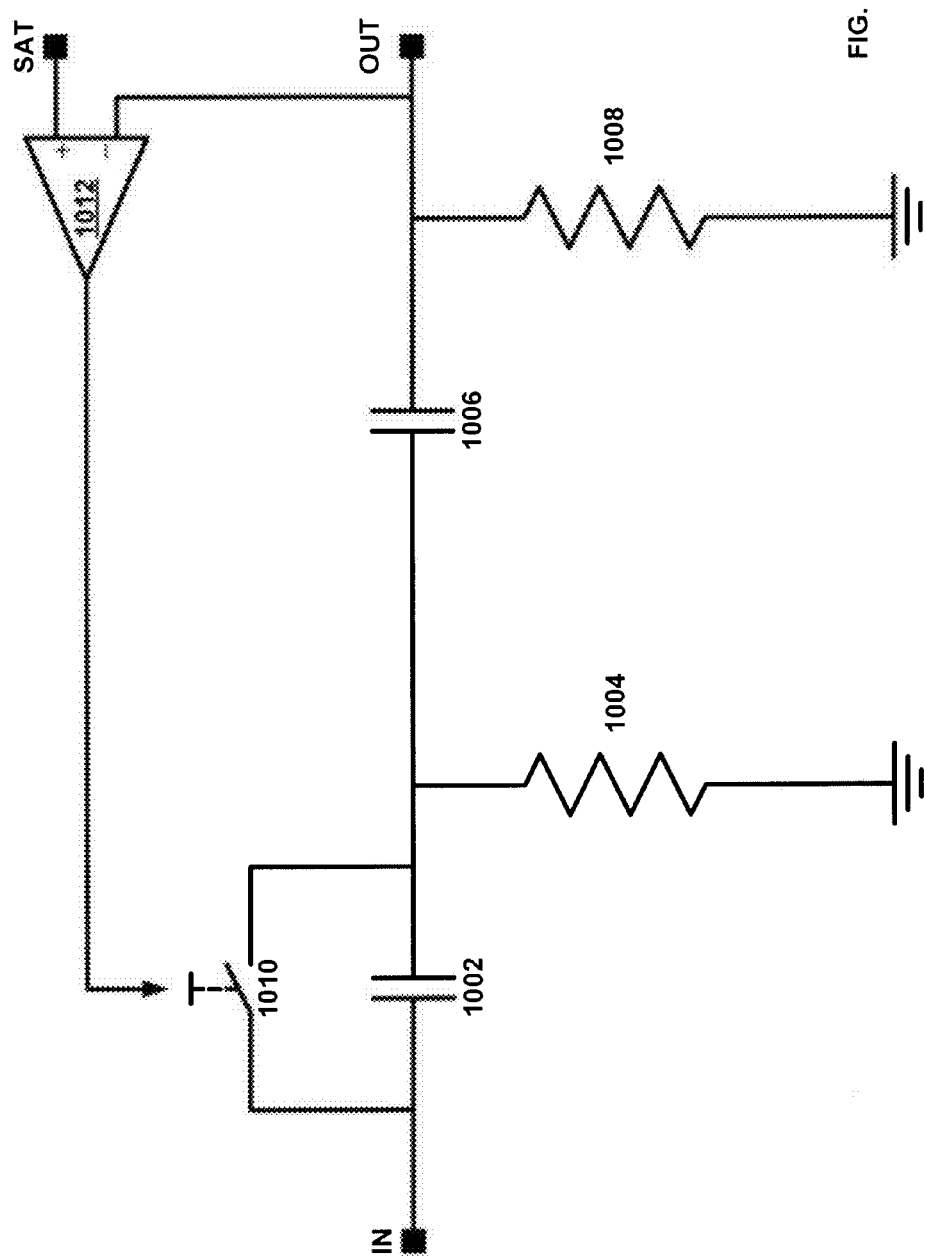
FIG. 10 shows an alternate exemplary embodiment of a second order RC high pass filter with smart saturation.

FIG. 10 shows an exemplary embodiment of a second order LC high pass filter. The LC high pass filter comprises capacitor 1002, resistor 1004, capacitor 1006, resistor 1008. This configuration is a cascade of two first-order high pass filters. Each stage has its own time constant. For example, if the resistances of resistors 1004 and 1008 are $R_1$ and $R_2$, respectively, and the capacitance of capacitors 1002 and 1006 are $C_1$ and $C_2$, respectively, then the time constant of the first stage is $\tau_1 = R_1 C_1$, and the time constant of the second stage is $\tau_2 = R_2 C_2$. In addition, switch 1010 can be placed across either of capacitors 1002 or 1006, but is shown placed across capacitor 1002. In one exemplary embodiment, the stage having the shorter time constant can be selected for use with switch 1010.

Figure 11:
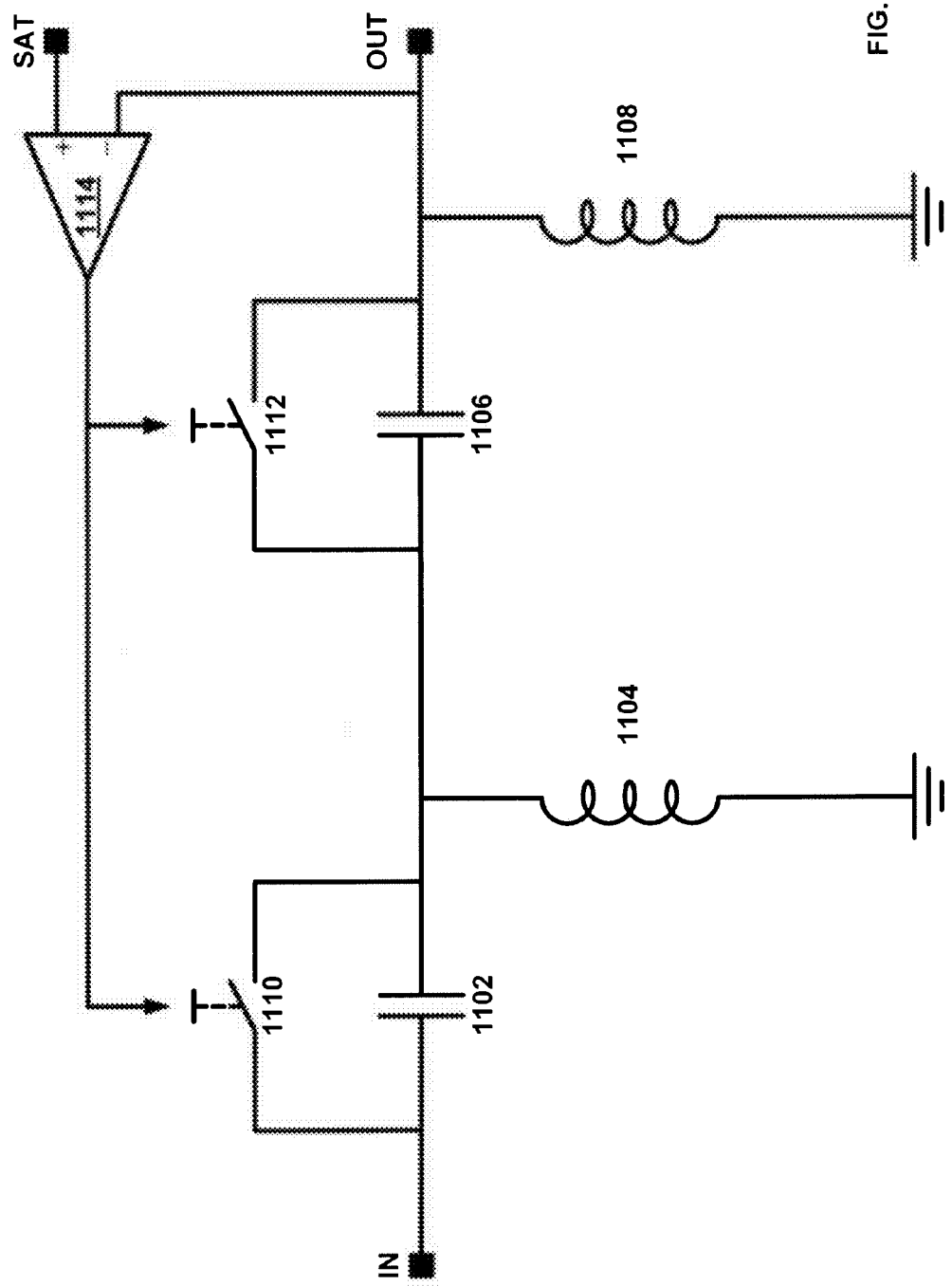
FIG. 11 shows an exemplary embodiment of a second order LC high pass filter with smart saturation.

FIG. 11 shows an exemplary embodiment of a second order LC high pass filter with smart saturation, and includes capacitor 1102, inductor 1104, capacitor 1106, inductor 1108, saturation detection circuit 1114, switch 1110 in parallel with capacitor 1102, and switch 1112 in parallel with capacitor 1106. If the inductances of inductors 1104 and 1108 are $L_1$ and $L_2$, respectively, and the capacitance of capacitors 1102 and 1106 are $C_1$ and $C_2$, respectively, then the time constant of the first stage will be $\tau_1 = (L_1 C_1)^{1/2}$ and the time constant of the second stage will be $\tau_2 = (L_2 C_2)^{1/2}$. When the filter output exceeds the saturation level, switches 1110 and 1112 both closed to relieve the state in the high pass filter until the output levels no longer exceed the saturation level. During this period, both capacitors 1102 and 1106 are discharged.

Figure 12:
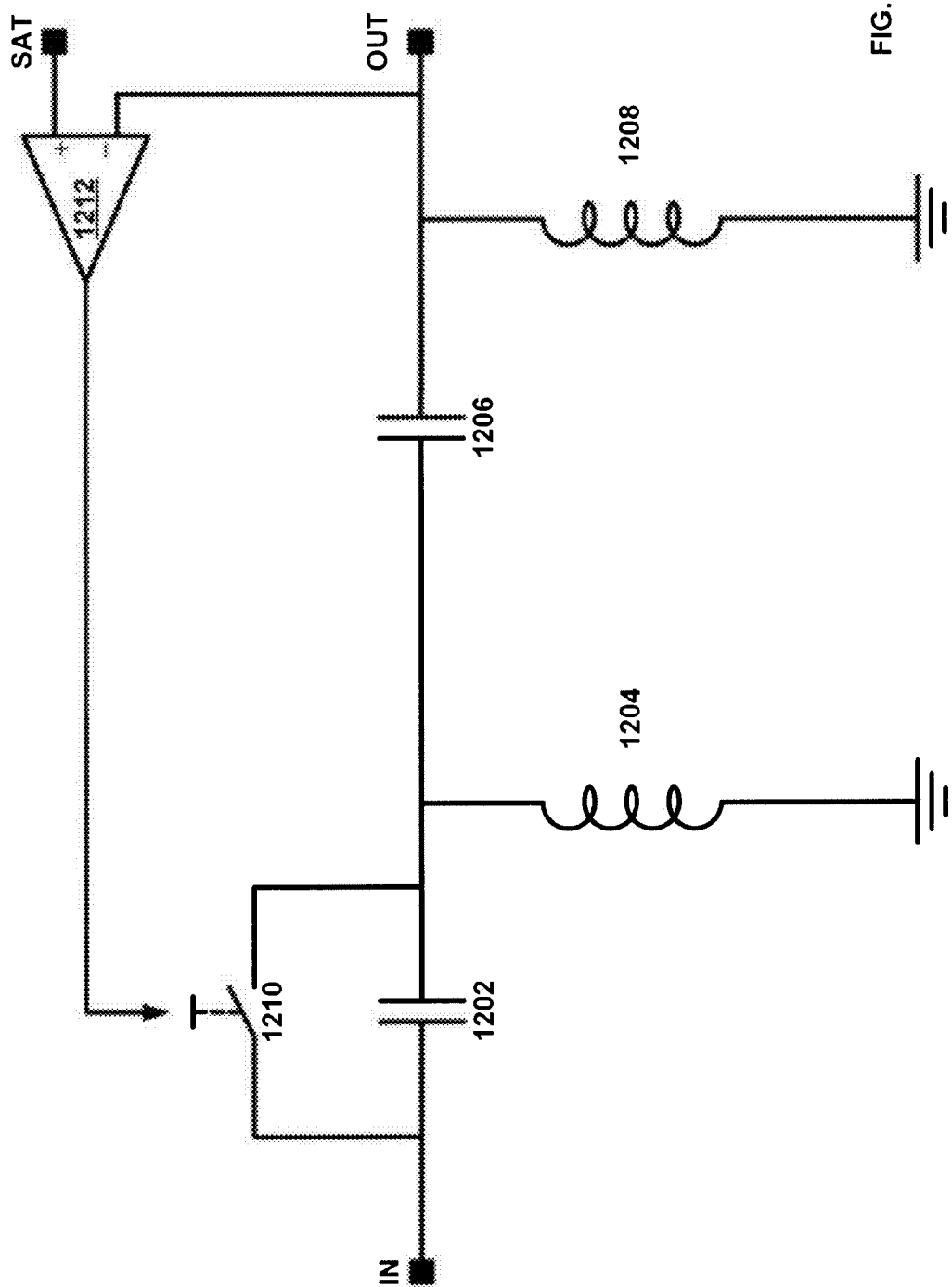
FIG. 12 shows an alternate exemplary embodiment of a second order RC high pass filter with smart saturation.

Alternatively not all capacitors need to be discharged. FIG. 12 shows an alternate exemplary embodiment of a second order RC high pass filter with smart saturation, having capacitor 1202, inductor 1204, capacitor 1206, inductor 1208, saturation detection circuit 1212 and switch 1210 in parallel with either one of the capacitors. In this example, switch 1210 is in parallel with capacitor 1202. When the filter output exceeds the saturation level switch 1210 is closed to relieve the state in capacitor 1202, until the output levels no longer exceed the saturation level. While switch 1210 could have been selected to short either capacitor, the capacitor associated with the stage with the shorter time constant can be shorted.

The principles demonstrated here can also or alternatively be applied to third order and higher order high pass filters. It should be noted that though in the designs described above, only a single capacitor need be shorted when the output level rises above saturation, in some more complex designs capacitors may need to be shorted in pairs or groups. In the preceding examples, the poles in the z-transform of the transfer functions are real. However, in more elaborate high pass filter designs, the z-transform may have poles in conjugate pairs. In such a high pass filter designs, the capacitors associated with each conjugate pair should be shorted simultaneously.

Figure 13:
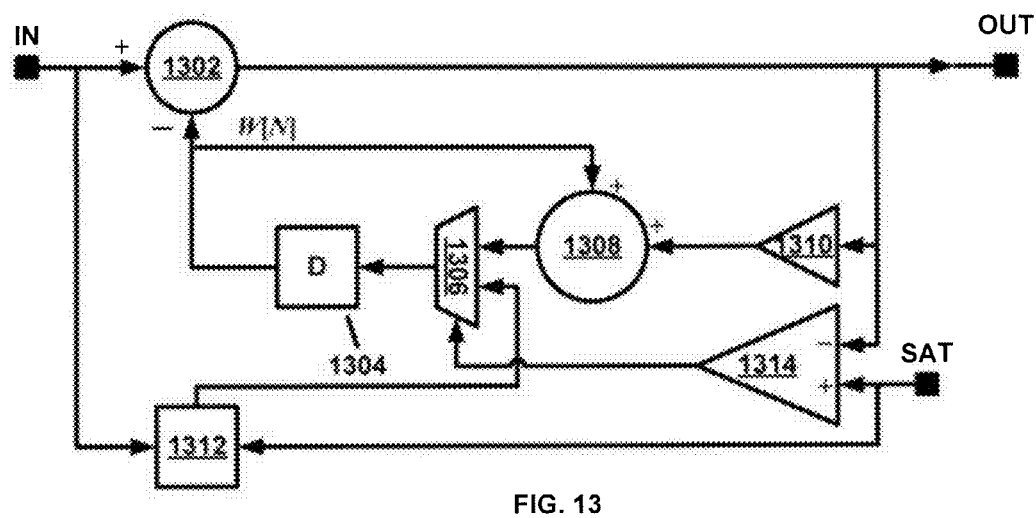
FIG. 13 shows an exemplary embodiment of a first order IIR digital high pass filter with smart saturation.

FIG. 13 shows an exemplary embodiment of a first order IIR digital high pass filter with smart saturation, having subtractor 1302, gain element 1310, adder 1308, delay element 1304, saturation detector 1314, multiplexer 1306 and circuit 1312, which supplies a new state to delay element 1304. Saturation detector 1314 functions essentially the same way as described previously. However, in a digital circuit, it can be implemented in software, for example, by the function:

$$f(x) = \begin{cases} 1 & \text{if } x > SAT \\ 1 & \text{if } x < -SAT \\ 0 & \text{otherwise} \end{cases}$$

When the output level exceeds a saturation limit, multiplexer 1306 selects the output of circuit 1312 to load into delay element 1304. The output of circuit 1312 is designed to produce an output level precisely equal to the saturation level, specifically, it implements the function:

$$g(x[n], y[n]) = \begin{cases} x[n] - SAT & \text{if } y[n] > SAT \\ SAT + x[n] & \text{if } y[n] < -SAT \end{cases}$$

When the output level does not exceed either saturation limit, multiplexer 1306 selects the output of adder 1308, in which case the filter functions normally.

In the case where the output level exceeds the saturation level, the first time sample after saturation is realized at the output is still above the saturation level, because it takes one time period for the reloaded delay element to propagate through the filter. Therefore, a clipping circuit can also be used in conjunction with this filter to prevent an over-saturation spike.

Figure 14:
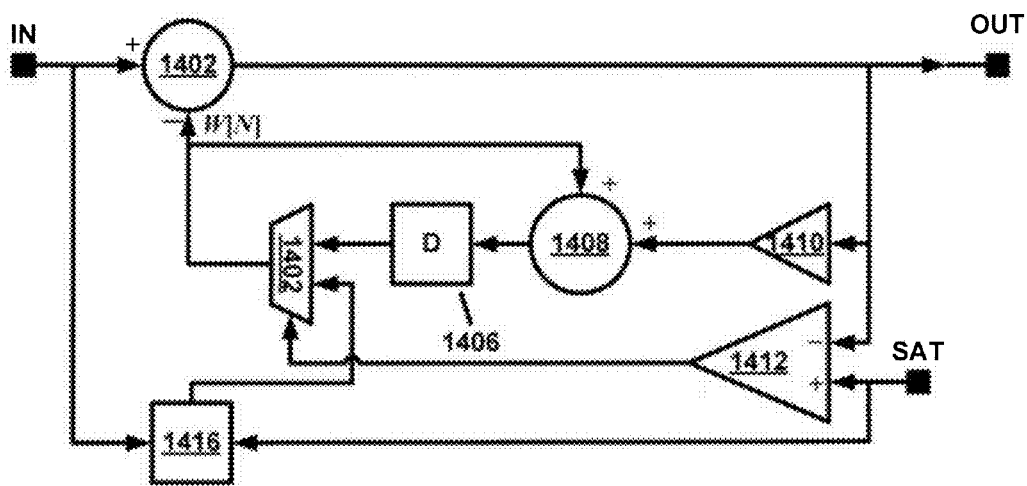
FIG. 14 shows an exemplary embodiment of a first order IIR digital high pass filter with smart saturation.

FIG. 14 shows an exemplary embodiment of a first order IIR digital high pass filter with smart saturation, which includes subtractor 1402, gain element 1410, adder 1408, delay element 1406, saturation detector 1412, multiplexer 1402 and circuit 1416, which generates a value that can be used to override the state stored in delay element 1406. Saturation detector 1412 and circuit 1416 each function essentially the same way as described previously with respect to FIG. 13, and circuit 1416 can generate the same value as described previously. When there is no saturation detected by saturation detector 1412, the filter performs normally as a high pass filter. However, when saturation is detected, the state stored in delay element 1406 is overridden by the value generated by circuit 1416. Multiplexer 1402 is used to override the stored state. As an analog circuit, there is an instant when the output level rises above the saturation level, but is immediately brought within the bounds of the saturation levels by substituting the state stored in delay element 1406 with the value generated by circuit 1416. This momentary spike is has no effect because, as a digital circuit, only the value at the clock edge is used. Since the spike does not occur at a clock edge, the spike value is never seen by the digital circuit.

Figure 15:
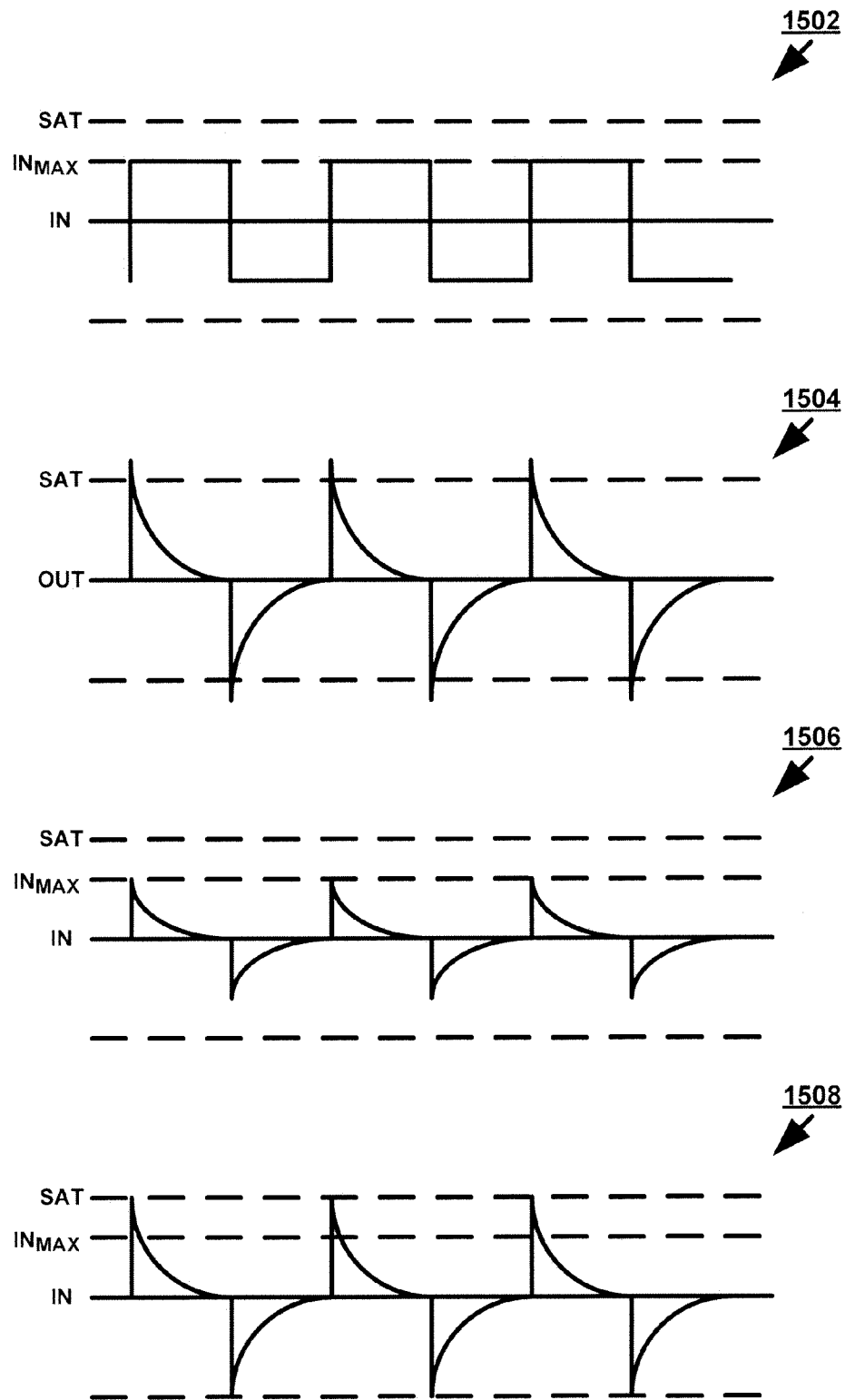
FIG. 15 illustrates the signaling of high pass filters with smart saturation.

FIG. 15 illustrates the signaling of high pass filters with smart saturation. Graph 1502 shows the input signal with amplitude $IN_{MAX}$. Graph 1504 shows an output signal when no smart saturation circuit is used. In this example, $IN_{MAX}$ is chosen small enough so that the peaks in the output of the high pass filter barely exceeds the saturation level. If the state of the filter were zeroed out when the saturation level is exceeded, the output shown in graph 1506 would be seen. The peaks in the output would begin at $IN_{MAX}$ which could result in an over attenuation by a factor of 2. If the state of filter were altered so that the peaks begin at the saturation level, the output shown in graph 1508 would be seen.

Figure 16:
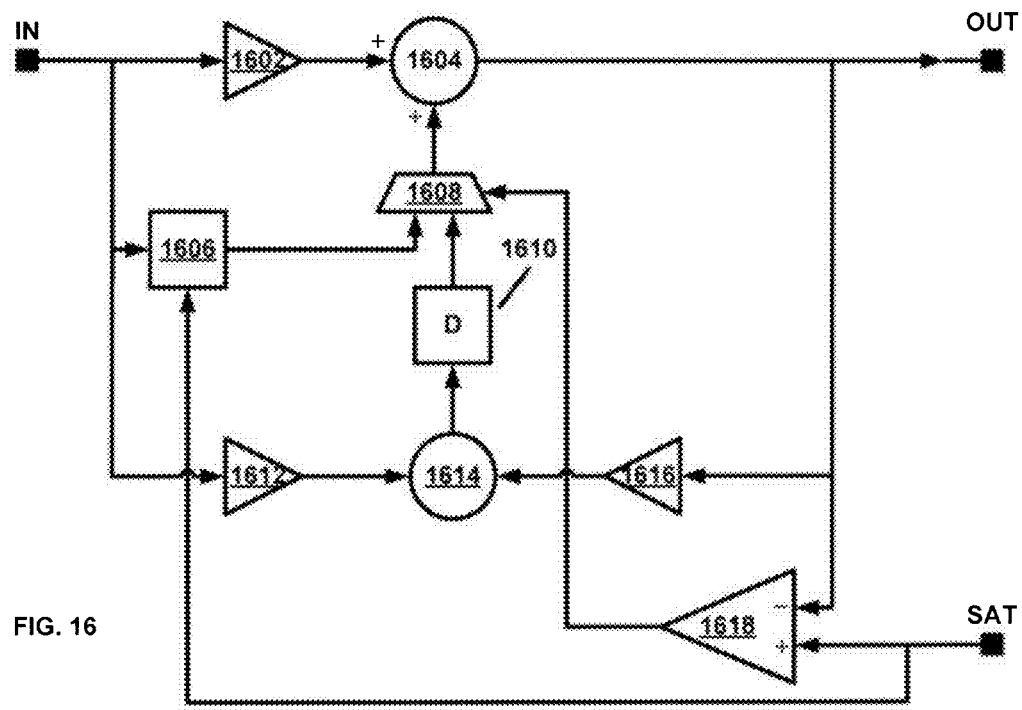
FIG. 16 shows an exemplary embodiment of a first order IIR filter with smart saturation.

FIG. 16 shows an exemplary embodiment of a first order IIR filter with smart saturation, which includes adder 1604, delay element 1610, gain elements 1602, 1612 and 1616, saturation detection circuit 1618, multiplexer 1608 and substitute state unit 1606. When saturation detection circuit 1618 detects an output exceeding the saturation level, it causes multiplexer 1608 to substitute a value generated by substitute state unit 1606 for the state stored in delay element 1610. Substitute state unit 1606 differs slightly from the circuits described above, as the function implemented by substitute state unit 1606 is given by the following formula:

$$g(x[n], y[n]) = \begin{cases} SAT - b_0 x[n] & \text{if } y[n] > SAT \\ -SAT - b_0 x[n] & \text{if } y[n] < -SAT. \end{cases}$$

When saturation is seen at the output, substitute state unit 1606 causes the output to fall to one of the saturation levels.

Figure 17:
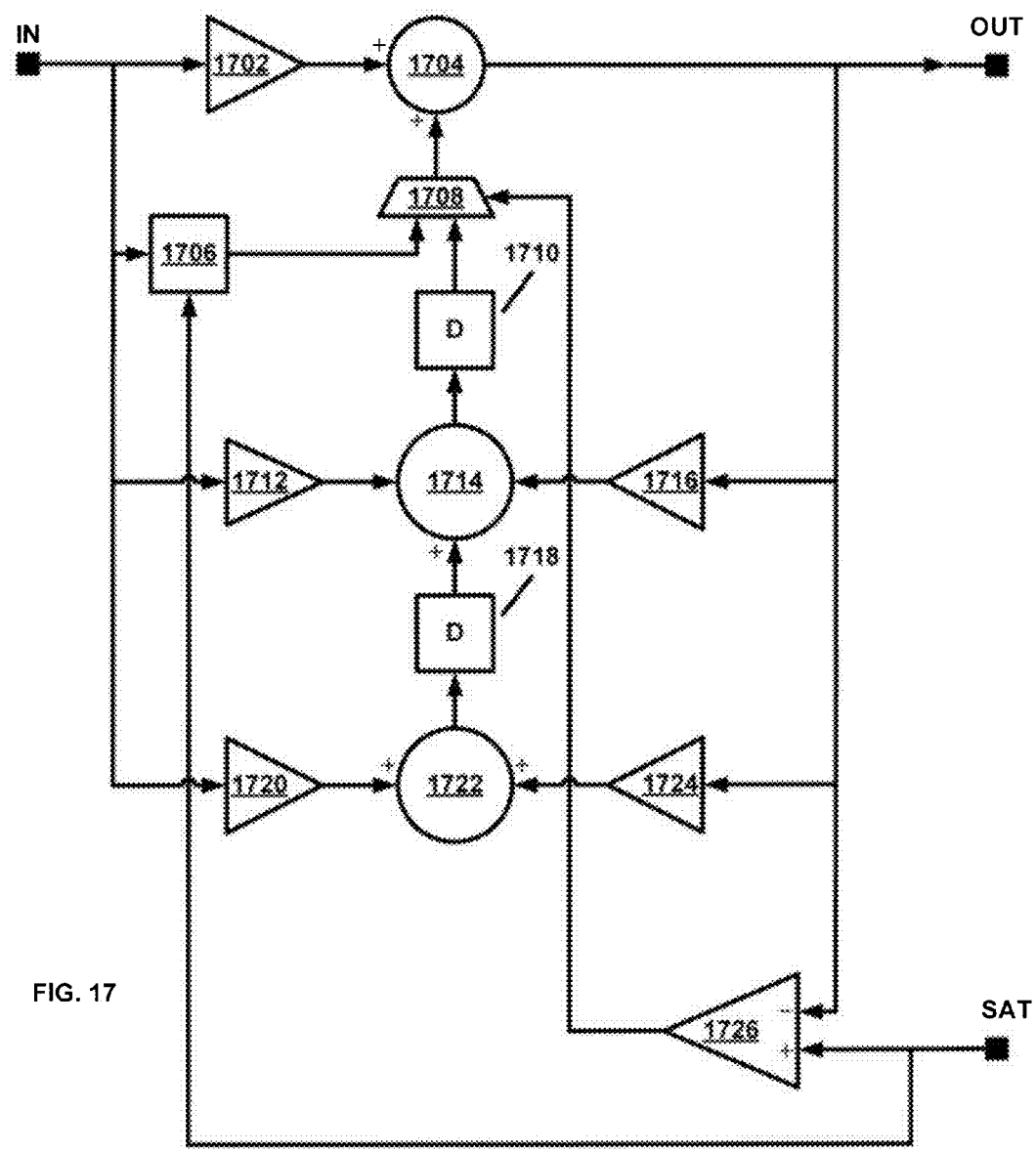
FIG. 17 shows an exemplary embodiment of a second order IIR filter with smart saturation.

FIG. 17 shows an exemplary embodiment of a second order IIR filter with smart saturation, which includes adder 1704, adder 1714, adder 1722, delay element 1710, delay element 1718, and gain elements 1702, 1712, 1716, 1720 and 1724. It further comprises saturation detection circuit 1726, multiplexer 1708 and substitute state unit 1706. When saturation detection circuit 1726 detects the output exceeding the saturation level, it causes multiplexer 1708 to substitute a value generated by substitute state unit 1706 for the state stored in delay element 1910. When saturation is seen at the output, substitute state unit 1706 causes the output to fall to one of the saturation levels.

It should be emphasized that the above-described embodiments are merely examples of possible implementations. For example, the embodiments described herein are applied to audio systems, but the high pass filters described herein could easily be applied to other communications applications. Many variations and modifications may be made to the above-described embodiments without departing from the principles of the present disclosure. All such modifications and variations are intended to be included herein within the scope of this disclosure and protected by the following claims.

What is claimed:

1. An audio processing system comprising:
   an audio filter having one or more elements capable of having state;
   a saturation detector configured to detect saturation of the audio filter and to generate an output when saturation of the filter is detected, further comprising:
   a first comparator receiving a positive saturation level signal and an input signal and generating the output when the input signal exceeds the positive saturation level signal; and
   a second comparator receiving a negative saturation level signal and the input signal and generating the output when the input signal is lower than the negative saturation level signal; and
   a switch coupled to the audio filter and the saturation detector, wherein the state of one or more of the elements of the audio filter is changed when the saturation detector provides the output to the switch.

2. The audio processing system of claim 1, wherein one or more of the elements of the audio filter capable of having state comprises one of a capacitor, an inductor, or a delay.

3. The audio processing system of claim 1 wherein the saturation detector comprises
   an OR gate receiving the first saturation output and the second saturation output and generating the saturation detector output if either of the first saturation output and the second saturation output are present.

4. The audio processing system of claim 1, wherein the audio filter comprises one of a first order analog audio filter, a second order analog audio filter, a first order digital audio filter or a second order digital audio filter.

5. The audio processing system of claim 1, wherein the switch comprises one of a transistor or a multiplexer.

6. An audio processing system comprising:
- an audio filter having one or more elements capable of having state;
- a saturation detector configured to detect saturation of the audio filter and to generate an output when saturation of the filter is detected,
- a switch coupled to the audio filter and the saturation detector, wherein the state of one or more of the elements of the audio filter is changed when the saturation detector provides the output to the switch, wherein the audio filter comprises one of a first order analog audio filter, a second order analog audio filter, a first order digital audio filter or a second order digital audio filter, wherein the switch comprises one of a transistor or a multiplexer, and wherein the saturation detector comprises:
- a first comparator receiving a positive saturation level signal and an input signal and generating a first saturation output when the input signal exceeds the positive saturation level signal;
- a second comparator receiving a negative saturation level signal and the input signal and generating a second saturation output when the input signal is lower than the negative saturation level signal; and
- an OR gate receiving the first saturation output and the second saturation output and generating the saturation detector output if either of the first saturation output and the second saturation output are present.

7. A method for processing audio comprising:
receiving an audio signal at a filter;
determining whether the filter is approaching a saturation level by generating a control signal if an audio signal is greater than a high saturation threshold level or is lower than a low saturation threshold level;
bypassing a state element of the filter if the filter is approaching the saturation level; and
re-engaging the state element after a predetermined period of time.

8. The method of claim 7 wherein determining whether the filter is approaching the saturation level comprises determining whether a control signal has been received from a saturation detector.

9. The method of claim 7 wherein determining whether the filter is approaching the saturation level comprises generating a control signal if an audio signal is greater than a high saturation threshold level.

10. The method of claim 7 wherein determining whether the filter is approaching the saturation level comprises generating a control signal if an audio signal is lower than a low saturation threshold level.

11. The method of claim 7 wherein bypassing the state element of the filter comprises bypassing one of a capacitor, an inductor or a delay element.

12. The method of claim 7 wherein bypassing the state element of the filter comprises bypassing the state element of the filter with a switch or a multiplexer.

13. An audio processing system comprising:
- an audio filter having one or more elements capable of having state;
- a saturation detector for detecting saturation of the audio filter and generating a bypass signal, comprising:
- a first comparator receiving a positive saturation level signal and an input signal and generating a first saturation output when the input signal exceeds the positive saturation level signal;
- a second comparator receiving a negative saturation level signal and the input signal and generating a second saturation output when the input signal is lower than the negative saturation level signal; and
- an OR gate receiving the first saturation output and the second saturation output and generating the saturation detector output if either of the first saturation output and the second saturation output are present; and
- a switch coupled to the audio filter and the saturation detector for detecting saturation, wherein the state of one or more of the elements of the audio filter is changed when the bypass signal is received by the switch.

14. The audio processing system of claim 13 wherein the switch comprises means for bypassing a state element of the audio filter.

15. The audio processing system of claim 13 wherein the state of one or more of the elements of the audio filter is changed by shorting the element out of the filter.

16. The audio processing system of claim 13 wherein the state of one or more of the elements of the audio filter is changed by multiplexing a delay value to the element.

17. The audio processing system of claim 13, wherein the audio filter comprises one of a first order analog audio filter, a second order analog audio filter, a first order digital audio filter or a second order digital audio filter.

* * * * *